(12) United States Patent
Lu

(10) Patent No.: US 12,322,639 B2
(45) Date of Patent: Jun. 3, 2025

(54) HYBRID BOND METHOD FOR FIXING DIES

(71) Applicant: SAULTECH TECHNOLOGY CO., LTD., Hsinchu County (TW)

(72) Inventor: Yen Hao Lu, Zhubei (TW)

( * ) Notice: Subject to any disclaimer, the term of this patent is extended or adjusted under 35 U.S.C. 154(b) by 615 days.

(21) Appl. No.: 17/686,661

(22) Filed: Mar. 4, 2022

(65) Prior Publication Data

US 2022/0367232 A1 Nov. 17, 2022

Related U.S. Application Data

(60) Provisional application No. 63/189,468, filed on May 17, 2021.

(51) Int. Cl.
| | |
|---|---|
| *H01L 21/683* | (2006.01) |
| *H01L 21/02* | (2006.01) |
| *H10D 84/01* | (2025.01) |

(52) U.S. Cl.
CPC .... *H01L 21/6836* (2013.01); *H01L 21/02076* (2013.01); *H10D 84/01* (2025.01); *H01L 2221/68331* (2013.01); *H01L 2221/68368* (2013.01); *H01L 2221/68386* (2013.01)

(58) Field of Classification Search
CPC ........... H01L 21/6836; H01L 21/02076; H01L 21/78; H01L 21/67132; H01L 2221/68368; H01L 2221/68327; H01L 2221/68336; H01L 2221/6839; H01L 2221/68331; H01L 2221/68386
See application file for complete search history.

(56) References Cited

U.S. PATENT DOCUMENTS

| | | | |
|---|---|---|---|
| 2014/0127885 A1* | 5/2014 | Grivna | H01L 21/78 438/464 |
| 2014/0134828 A1* | 5/2014 | Burghout | H01L 21/6836 438/464 |
| 2020/0176437 A1* | 6/2020 | Wimplinger | H01L 21/6836 |
| 2020/0294839 A1* | 9/2020 | Lee | B32B 43/006 |

* cited by examiner

*Primary Examiner* — Yara B Green
*Assistant Examiner* — Coralie A Nettles

(57) ABSTRACT

A hybrid die bonding method includes the following steps: dicing a wafer into a plurality of dies arranged on a plurality of target blocks of a carrier film, wherein surfaces of each of the dies have no solder and bump; cleaning particulate from first surfaces of the dies; separating side portions and corner portions of second surfaces of the dies from the target blocks; turning the carrier film and transferring the dies to a first carrier, wherein the first surfaces of the dies contact the first carrier; removing the carrier film from the second surfaces of the dies; cleaning particulate from the second surfaces of the dies; and transferring the dies from the first carrier to a substrate, wherein a surface of the substrate has no solder and bump. As such, the method reduces the adhesive force between the dies and the carrier film.

9 Claims, 26 Drawing Sheets

HYBRID BOND METHOD FOR FIXING DIES

BACKGROUND OF THE INVENTION

1. Field of the Invention

The present invention relates generally to a die bonding method, and more particularly, to a hybrid bond method of fixing dies.

2. The Prior Arts

An integrated circuit (IC) is fabricated on a semiconductor wafer through a process with many steps, and the wafer is further cut into a plurality of dies. In other words, a die is a small piece of an integrated circuit made of semiconductor material that is not yet packaged. The plurality of cut dies are neatly attached to the plurality of target blocks of a carrier film. During the wafer dicing process, many particles or particulates are generated, which adhere to the surfaces of the dies. Then, particles on the first surfaces of the die are removed. Then, the dice are stripped from the target blocks using a conventional die stripping method. Finally, a pick-up device sequentially transfers the die from the carrier film to a substrate, and the second surface of the die contacts the substrate for subsequent processing.

FIG. 1 is a schematic view of a first conventional method of die stripping, or peeling off the die. As shown in FIG. 1, a valve 200 moves horizontally along the surface of the carrier film 210 to gradually open a channel 2201 of an adsorption device 220. The channel 2201 can provide a negative pressure 2202 to adsorb one of the target blocks 2101, so that one of the target blocks 2101 is gradually recessed downward along a horizontal direction, and one of the die 230 is peeled off in entirety from one of the target blocks 2101. After one of the die 230 completes the stripping process, the adsorption device 220 continues to perform the stripping process on the next die 230 until all the dies 230 complete the stripping process.

FIG. 2 is a schematic view of a second conventional method of die stripping. As shown in FIG. 2, a plurality of pushing members 240 push one of the target blocks 2101 so that one of the target blocks 2101 is raised upward. Wherein, the closer to the center of one of the target blocks 2101, the greater the upward moving distance of the pushing members 240, and the height of one of the target blocks 2101 is raised gradually from the periphery to the center, so that only the center of one of the die 230 contacts the center of one of the target blocks 2101. The periphery of one of the die 230 is separated from one of the target blocks 2101. After one of the die 230 completes the stripping process, the pushing members 240 continue to perform the stripping process on the next die 230 until all the dies 230 complete the stripping process.

However, the above two conventional die stripping methods can only peel off one die from the carrier film at a time, and the pickup device can only pick up one die from the carrier film at a time, move the die, and then place the die on the substrate. Therefore, the transfer speed of these dies is relatively slow, the efficiency is low, and the cost is high.

In addition, the particles on the second surface of the dies are not cleaned, and the following problems arise: First, if the particles are located close to the edge of the dies, the particles will lift the dies, which will result in a decrease in the bonding yield between the die and the substrate. Second, if the particles are located close to the edge of the die, once the dies are stacked on each other, the particles will cause the die on the upper layer to lift up, resulting in a decrease in the bonding yield of stacking dies. Third, if the particles are located close to the center of the die, the particles will bend the die, and the die and the substrate will encapsulate the bubbles together to form a void, resulting in a decrease in the bonding yield of the die and the substrate.

SUMMARY OF THE INVENTION

A primary objective of the present invention is to provide a hybrid die bonding method, which can reduce the adherence effect of a plurality of dies to a carrier film, so that the dies can be transferred to a first carrier in one run, and the carrier film can be easily removed from the dies.

Another objective of the present invention is to provide a hybrid die bonding method, which can combine two adjacent rows of dies to complete the stripping process in one run, and a plurality of rows of dies can make complete the pre-edge/corner peeling in a plurality of runs, which improves the efficiency of the pre-edge/corner peeling of the dies.

Another objective of the present invention is to provide a hybrid die bonding method, which can completely remove the particles on the first surface and the second surface of the die, improve the bonding yield between the die and the substrate or the bonding yield of stacked dies, and the die and the substrate will not co-encapsulate the bubbles to form a void.

In order to achieve the aforementioned objectives, the present invention provides a hybrid die bonding method, comprising the following steps: dicing a wafer into a plurality of dies, the dies being distributed on a plurality of target blocks of a carrier film, and each die having a first surface on a top and a second surface on a bottom attached to the carrier film with no solder or bump on the first and second surfaces; removing particles on first surfaces of the plurality of dies; peeling off side portions and corner portions of the second surfaces of the dies away from the target blocks of the carrier film with remaining portions of the second surfaces of the dies still attached to the carrier film; turning over the carrier film, and transferring the plurality of dies to a first carrier with first surfaces of the dies contacting the first carrier; removing the carrier film from the second surfaces of the dies; cleaning particles on the second surfaces of the dies; and transferring the dies from the first carrier to a substrate, the substrate having no solder or bump on surfaces.

In a preferred embodiment, the step of removing particles on the first surfaces of the dies further includes a step of: de-bonding the carrier film.

In a preferred embodiment, the step of de-bonding the carrier film further includes the following step: the carrier film being a UV release film, and an ultraviolet light is irradiated on the carrier film.

In a preferred embodiment, the step of de-bonding the carrier film further includes the following step: the carrier film is a pyrolytic adhesive film, and the carrier film is heated.

In a preferred embodiment, the step of dicing the wafer into a plurality of dies further includes the following steps: dicing the wafer into a plurality of rows of dies, each row of dies comprising a plurality of dies, and the plurality of rows of dies being distributed on a plurality of rows of target blocks of the carrier film, and each row of target blocks comprising a plurality of target blocks; wherein, the step of peeling off the side portions and the corner portions of the second surfaces of the dies away from the target blocks further includes the following steps: pressuring connecting areas between two adjacent rows of target blocks of the carrier film upward or downwardly so that the side portions and the corner portions of the second surfaces of all the dies of the two adjacent rows of dies are peeled off away from all the target blocks of the two adjacent rows of target blocks; and after the two rows of dies complete peeling off process, continuing to perform peeling off process on another two adjacent rows of dies until the peeling process is completed for all the rows of dies.

In a preferred embodiment, the step of peeling off the side portions and the corner portions of the second surfaces of the dies from the target blocks further includes the step of: moving at least one pushing member upward to push connecting areas between the target blocks in sequence, and the target blocks being raised upward, so that the side portions and the corner portions of the second surfaces of the dies are peeled off from the target blocks.

In a preferred embodiment, the step of peeling off the side portions and the corner portions of the second surfaces of the dies from the target blocks further includes the step of: a scraper moving horizontally along the surface of the carrier film to push connecting areas between the target blocks in sequence, and the target blocks being raised upward, so that the side portions and the corner portions of the second surfaces of the dies are peeled off from the target blocks.

In a preferred embodiment, the step of peeling off the side portions and the corner portions of the second surfaces of the dies from the target blocks further includes the step of: at least one channel of an adsorption device providing a negative pressure to adsorb connecting areas between the target blocks, and the target blocks being recessed downward, so that the side portions and the corner portions of the second surfaces of the dies are peeled off from the target blocks.

In a preferred embodiment, the step of transferring the dies from the first carrier to the substrate further comprises the steps of: picking up the dies from the first carrier; moving the dies; and placing the dies on a substrate with first surfaces in contact with the substrate.

In a preferred embodiment, the step of transferring the dies from the first carrier to the substrate further comprises the steps of: flipping the first carrier and transferring the dies to a second carrier, the second surfaces of the dies contacting with the second carrier; removing particles from the first surfaces of the dies; picking up the dies from the second carrier; moving the dies; and placing the dies on a substrate, the second surfaces of the dies contacting with the substrate.

The effect of the present invention is that the present invention can reduce the adherence effect of the dies attached to the carrier film, so that the dies can be transferred to the first carrier in one run, and the carrier film can easily be directly removed from the second surface of the dies. Therefore, the transfer speed of the dies is relatively fast, the efficiency is high, and the cost is low.

Furthermore, the present invention can complete the peeling process by two adjacent rows of dies at a time. As long as the plurality of rows of die combinations undergoes the peeling process a few times, the side portions and the corner portions of the second surfaces of the dies can be peeled off from the target blocks, which greatly shortens the pre-edge/corner peeling time of the dies, and improves the pre-edge/corner peeling efficiency of the dies.

In addition, the present invention can completely remove the particles on the first surface and the second surface of the die, so that the die-substrate bonding yield will be improved regardless of whether the first surface or the second surface of the die is bonded to the substrate, and the die and the substrate do not co-encapsulate air bubbles to form a void. If the dies are stacked on each other, the bonding yield of the dies can also be improved.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

The accompanying drawings are included to provide a further understanding of the invention, and are incorporated in and constitute a part of this specification. The drawings illustrate embodiments of the invention and, together with the description, serve to explain the principles of the invention.

Figure 1:
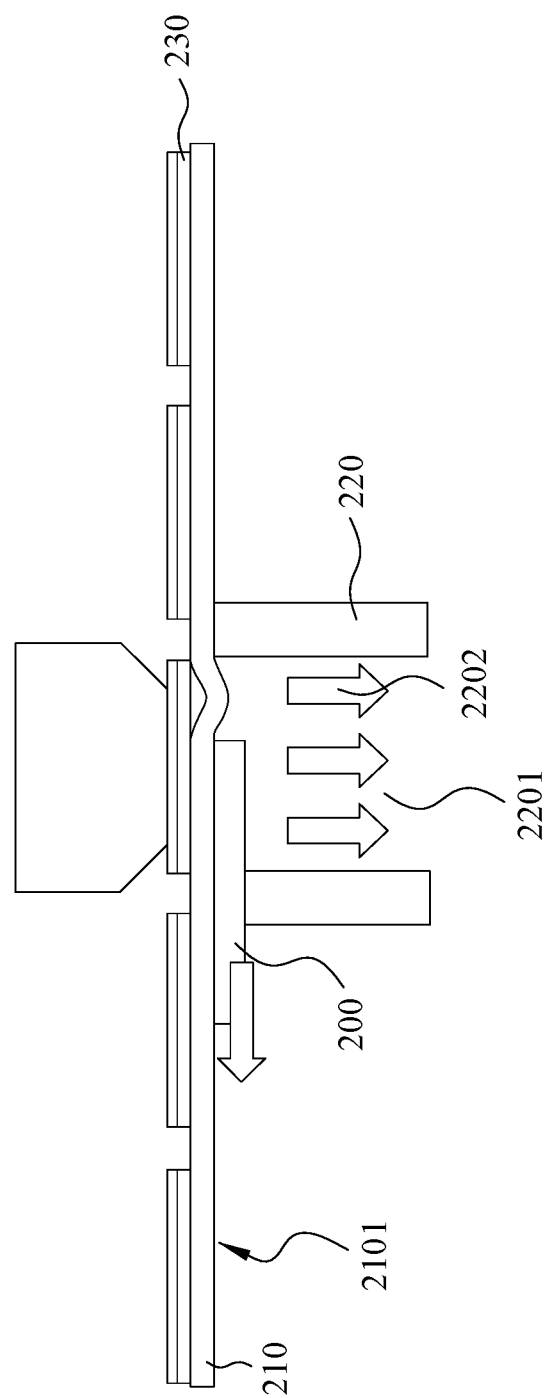
FIG. 1 is a schematic view of a first conventional method of die stripping.
Figure 2:
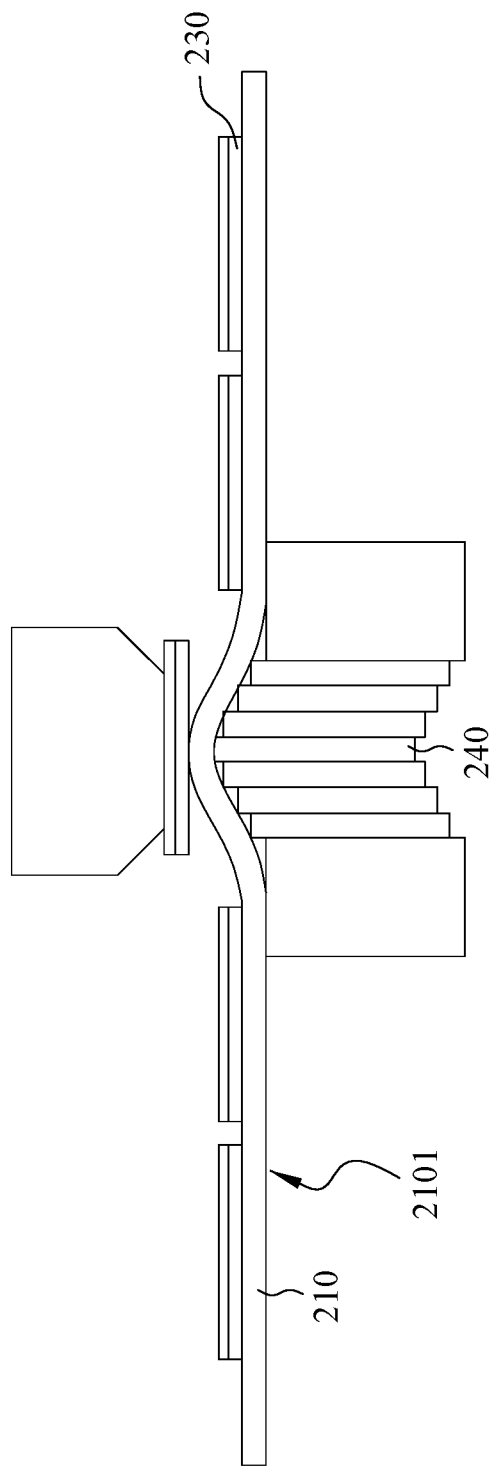
FIG. 2 is a schematic view of a second conventional die lift-off method.
Figure 3:
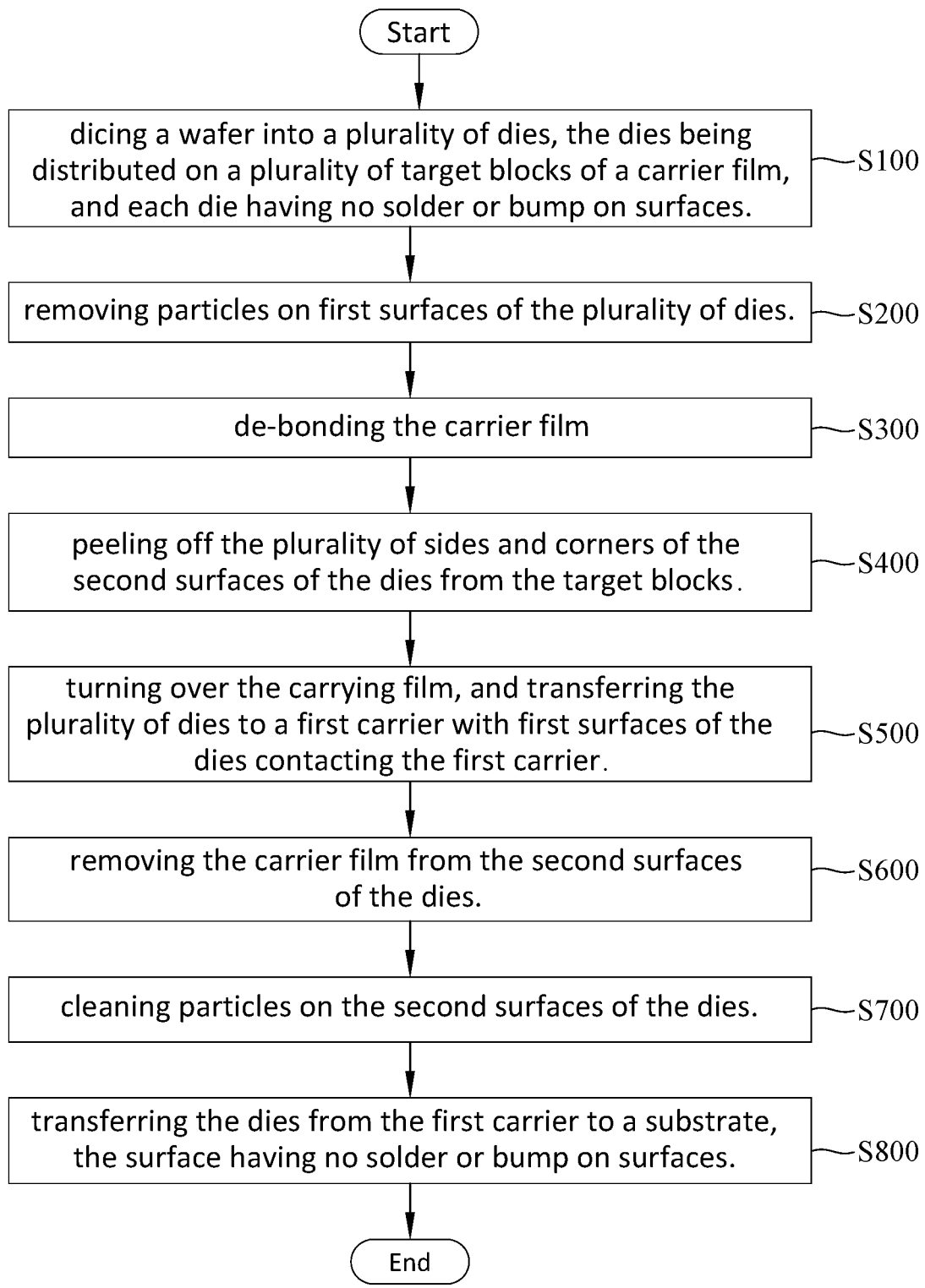
FIG. 3 is a flow chart of the hybrid die bonding method of the present invention.

FIG. 3 is a flow chart of the hybrid die bonding method of the present invention. As shown in FIG. 3, the present invention provides a hybrid die bonding method, which includes the following steps: Step S100: dicing a wafer 10 into a plurality of dies 11, and distributing the dies 11 in a plurality of target blocks 21 of a carrier film 20. Each die 10 has no solder balls and no copper bumps on the surfaces. Step S200: removing the particles 12 on the first surfaces 111 of the dies 11. Step S300: de-bonding the carrier film 20. Step S400: peeling off a plurality of side portions and corner portions of the second surfaces 112 of the dies 11 away from the target blocks 21. Step S500: turning the carrier film 20 over, and transferring the dies 11 to a first carrier 30, the first surfaces 111 of the dies 11 contacting with the first carrier 30. Step S600: removing the carrier film 20 from the second surfaces 112 of the dies 11. Step S700: removing the particles 12 on the second surfaces 112 of the dies 11; and Step S800: transferring the dies 11 from the first carrier 30 to a substrate 40, the surface of the substrate 40 is free of solder balls and copper bumps. A variety of implementations of steps S100 to S800 will be described in further detail below.

Figure 4:
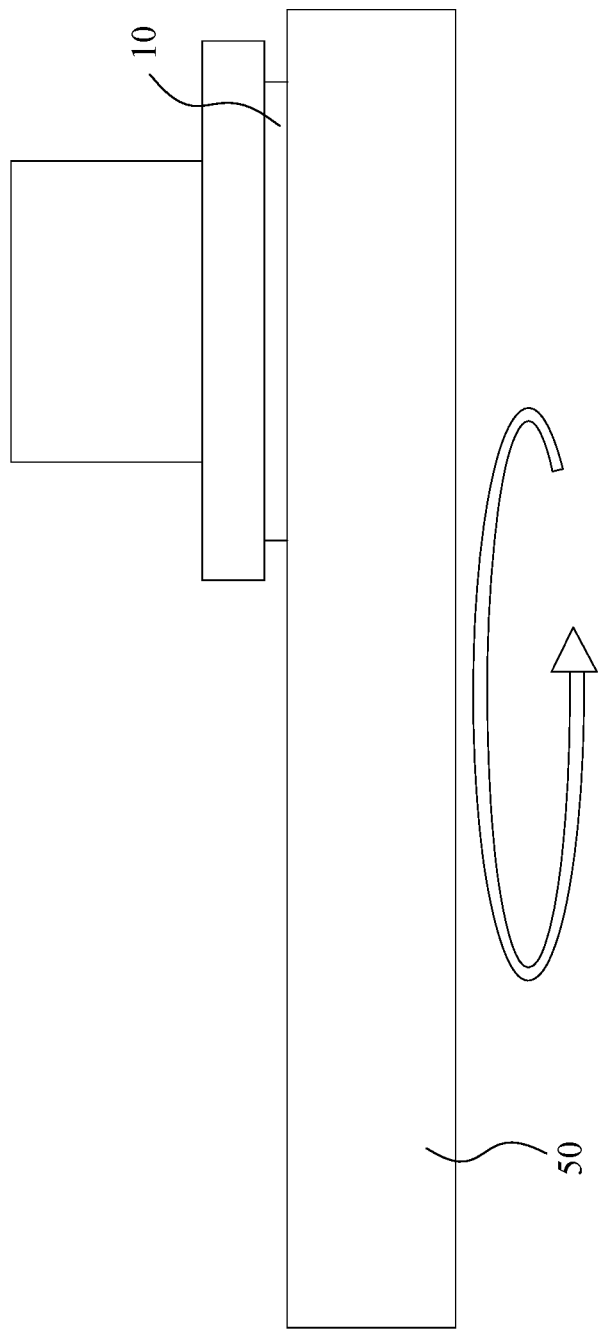
FIG. 4 is a schematic view of chemical-mechanical polishing in step S100 of the hybrid die bonding method of the present invention.
Figure 5A:
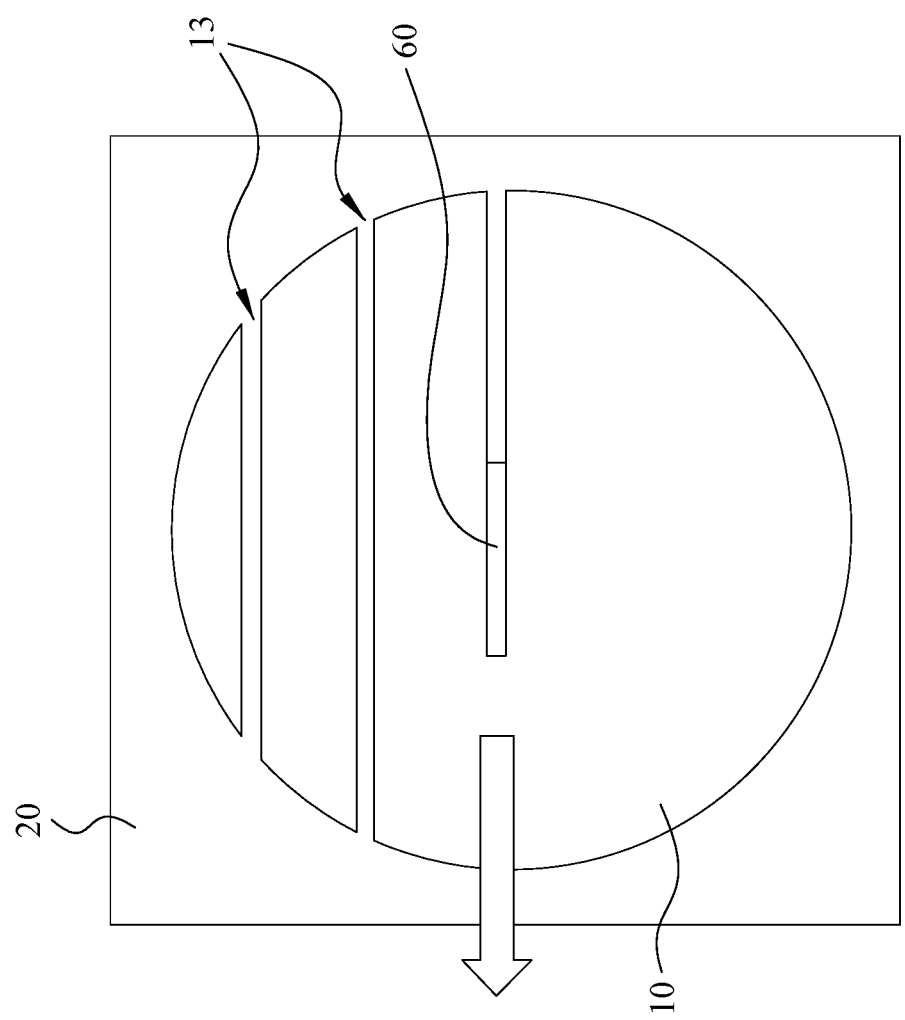
FIG. 5A is a top view of the mechanical dicing in step S100 of the hybrid die bonding method of the present invention.
Figure 5B:
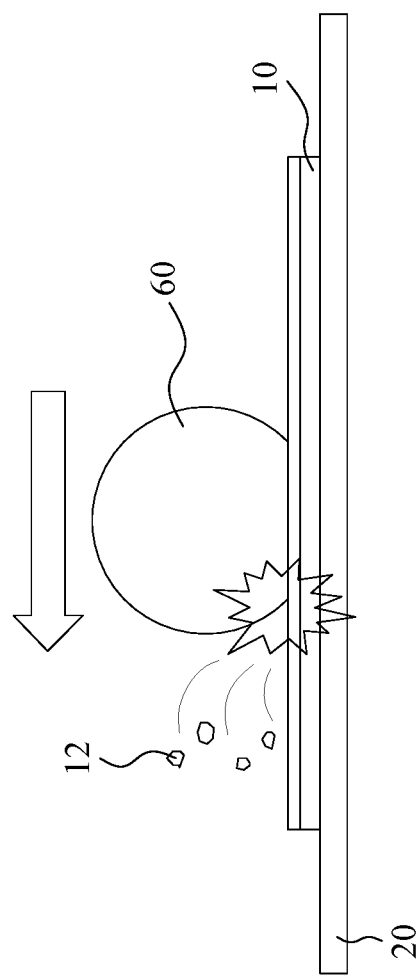
FIG. 5B is a schematic diagram of mechanical cutting in step S100B of the hybrid die bonding method of the present invention.

FIG. 4 is a schematic view of chemical-mechanical polishing in step S100 of the hybrid die bonding method of the present invention, and FIGS. 5A and 5B are respectively a top view and a schematic view of the mechanical dicing in step S100 of the hybrid die bonding method of the present invention. Step S100 further includes the following steps: chemical-mechanical polishing (CMP), a copper frame (not shown) is disposed on the first surface of the wafer 10 to form a plurality of logic circuit layers and a plurality of peripheral channels are formed on the periphery of the logic circuit layers; then, as shown in FIG. 4, a polishing pad (not shown) is disposed on a platform 50, the wafer 10 is placed on the polishing pad, and the copper frame is removed by chemical-mechanical polishing; and machine dicing, as shown in FIGS. 5A and 5B, using a diamond dicing knife 60 to cut a plurality of scribe lines 13 directly on the wafer 10, so that the wafer 10 is diced into a plurality of dies 11.

In other embodiments, laser dicing or plasma dicing can replace mechanical dicing and directly cut a plurality of dicing lines on the wafer, so that the wafer is diced into a plurality of dies.

Figure 6A:
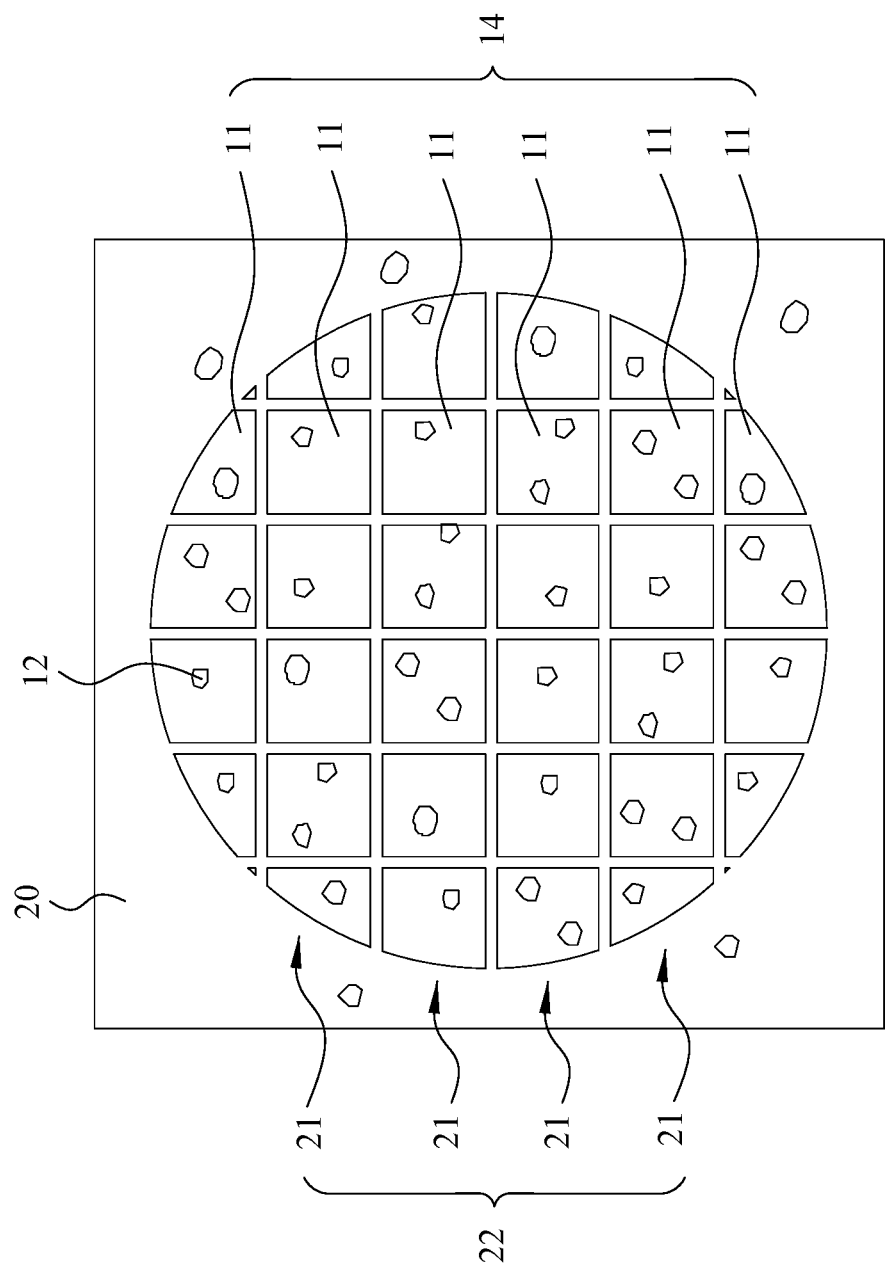
FIG. 6A is a top view of the dicing completed in step S100 of the hybrid method for fixing dies of the present invention.
Figure 6B:
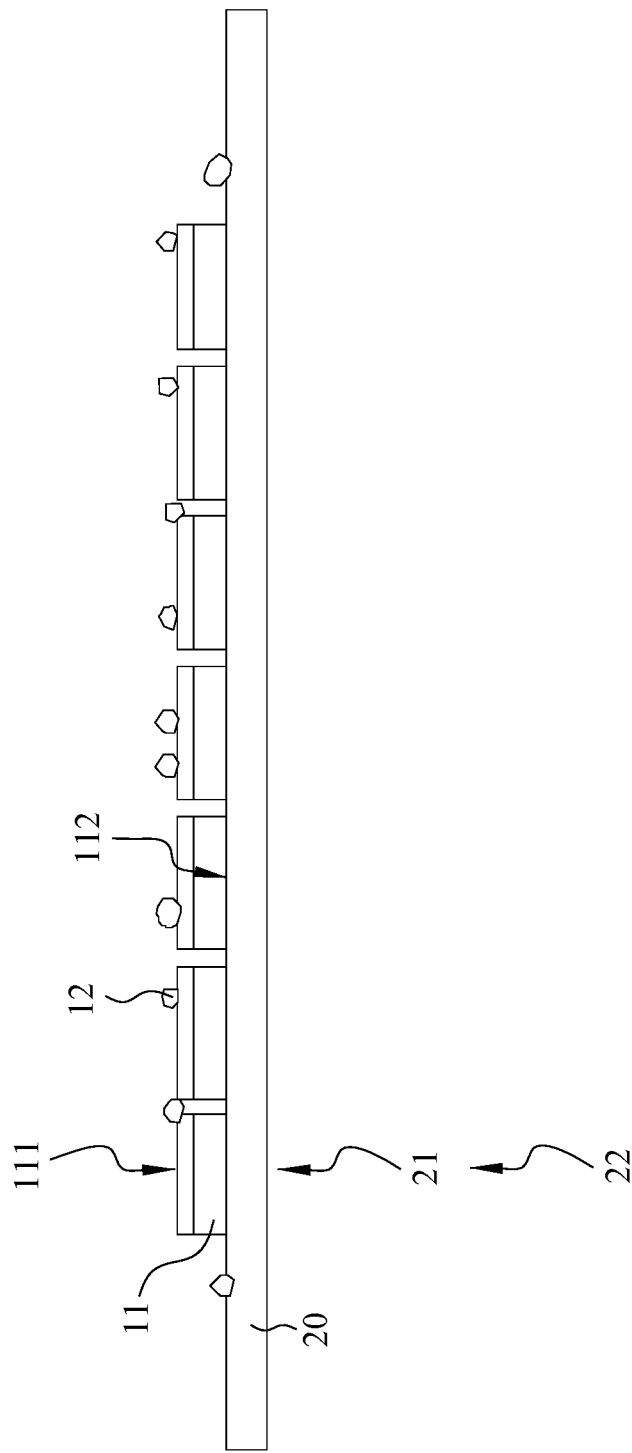
FIG. 6B is a schematic view of the completion of dicing in step S100 of the hybrid die bonding method of the present invention.

FIG. 6A and FIG. 6B are respectively a top view and a schematic view after the dicing is completed in step S100 of the hybrid die bonding method of the present invention. As shown in FIG. 6A and FIG. 6B, because the chemical-mechanical polishing will polish the surface of the wafer 10 to become very smooth, and the activation energy of chemical-mechanical polishing is relatively large, the particles 12 generated during the dicing process are easily attached to the surfaces of the dies 11.

Actually, as shown in FIG. 6A, the wafer 10 is diced into a plurality of rows of die combinations 14, each row of die combinations 14 includes a plurality of dies 11, and the plurality of rows of die combinations 14 are distributed on the carrier film 20 in the plurality of rows of target blocks 22 of the carrier film 20, each row of target blocks 22 includes a plurality of target blocks 21 of the carrier film 20.

Figure 7:
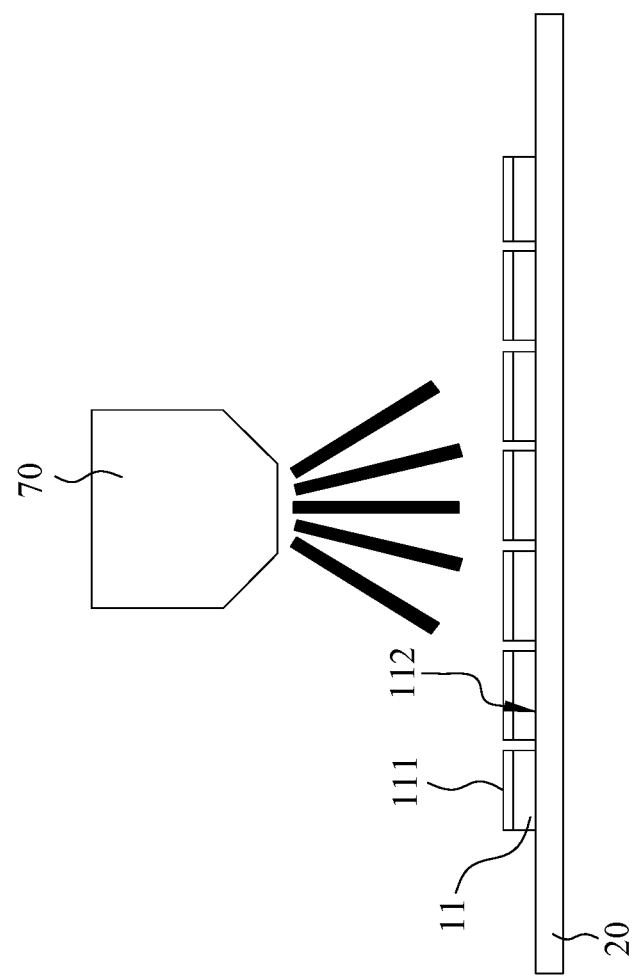
FIG. 7 is a schematic view of step S200 of the hybrid die bonding method of the present invention.

FIG. 7 is a schematic view of step S200 of the hybrid die bonding method of the present invention. In step S200, as shown in FIG. 7, a nozzle 70 sprays high-pressure gas, high-pressure liquid, or a mixture or plasma of high-pressure gas and high-pressure liquid on the first surfaces 111 of the dies 11, and the high-pressure gas, high-pressure liquid, or a mixture or plasma of high-pressure gas and high-pressure liquid can blow or disperse the particles 12 from the first surfaces 111 of the dies 11, so that the particles 12 on the first surfaces 111 of the dies 11 are completely removed.

Figure 8:
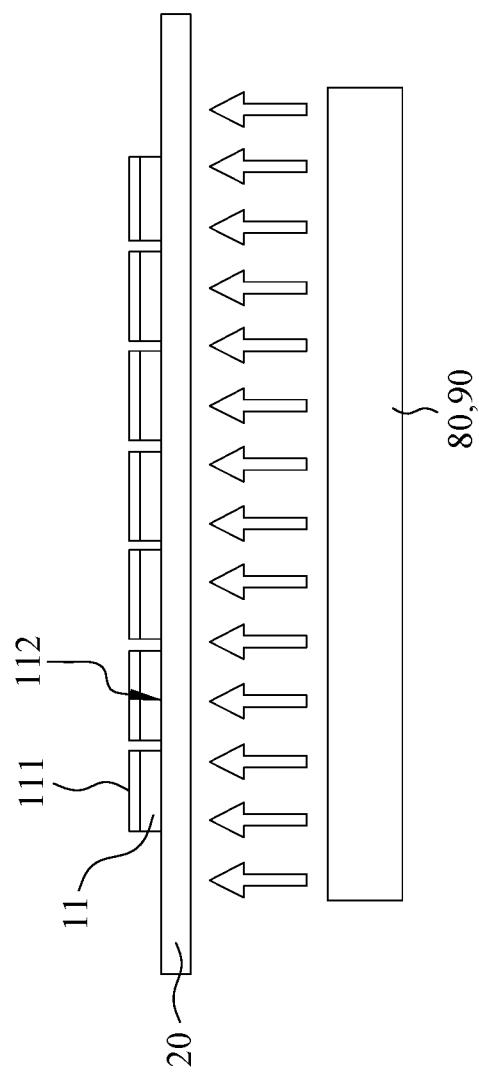
FIG. 8 is a schematic view of step S300 of the hybrid die bonding method of the present invention.

FIG. 8 is a schematic view of step S300 of the hybrid die bonding method of the present invention. In step S300, as shown in FIG. 8, the carrier film 20 is a UV release film or a thermal release film (pyrolytic adhesive film); when the carrier film 20 is a UV release film, a UV lamp 80 emits an ultraviolet light, and the ultraviolet light is irradiated on the carrier film 20; when the carrier film 20 is a pyrolytic adhesive film, a heating device 90 is applied to heat up the carrier film 20. Ultraviolet light can reduce the viscosity of UV release film, and high temperature can reduce the viscosity of pyrolytic adhesive film. After the step S300 is completed, because the viscosity of the carrier film 20 is reduced, the adhesive effect of the dies 11 being attached to the carrier film 20 is reduced, but the adhesiveness of the carrier film 20 is still sufficient to fix the dies 11 and the dies 11 do not detach from the carrier film 20.

In other embodiments, when the carrier film 20 is a low-viscosity film (e.g., blue film), the carrier film 20 does not need to be de-bonded to perform step S400, so step S300 in the those embodiments can be omitted.

Figure 9A:
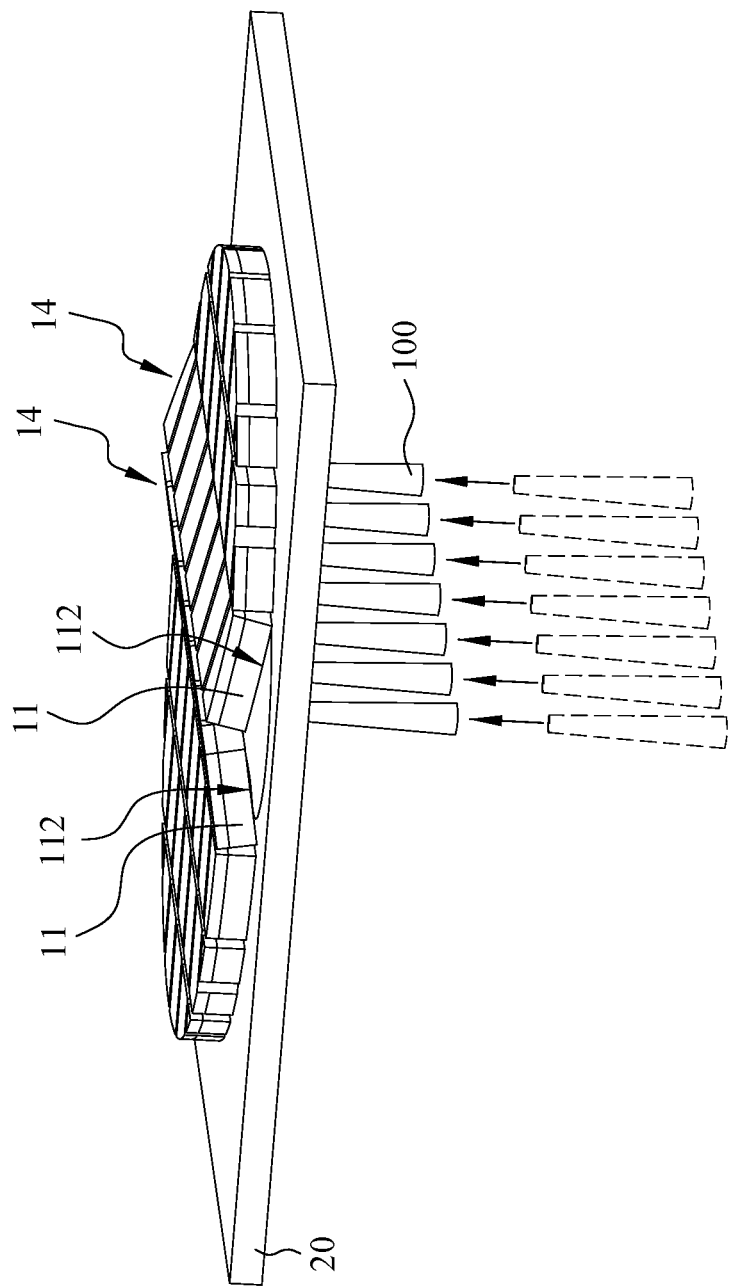
FIG. 9A is a perspective view of the first pre-edge/corner peeling method in step S400 of the hybrid die bonding method of the present invention.
Figure 9B:
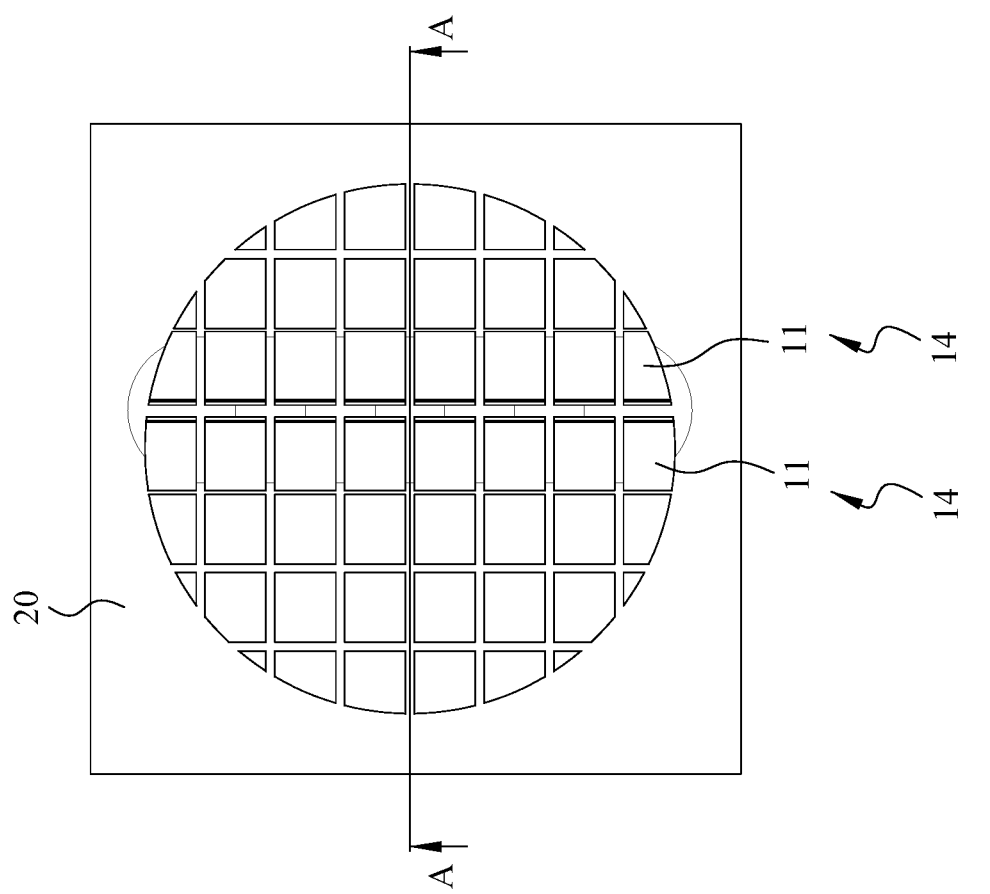
FIG. 9B is a top view of the first pre-edge/corner peeling method in step S400 of the hybrid die bonding method of the present invention.
Figure 9C:
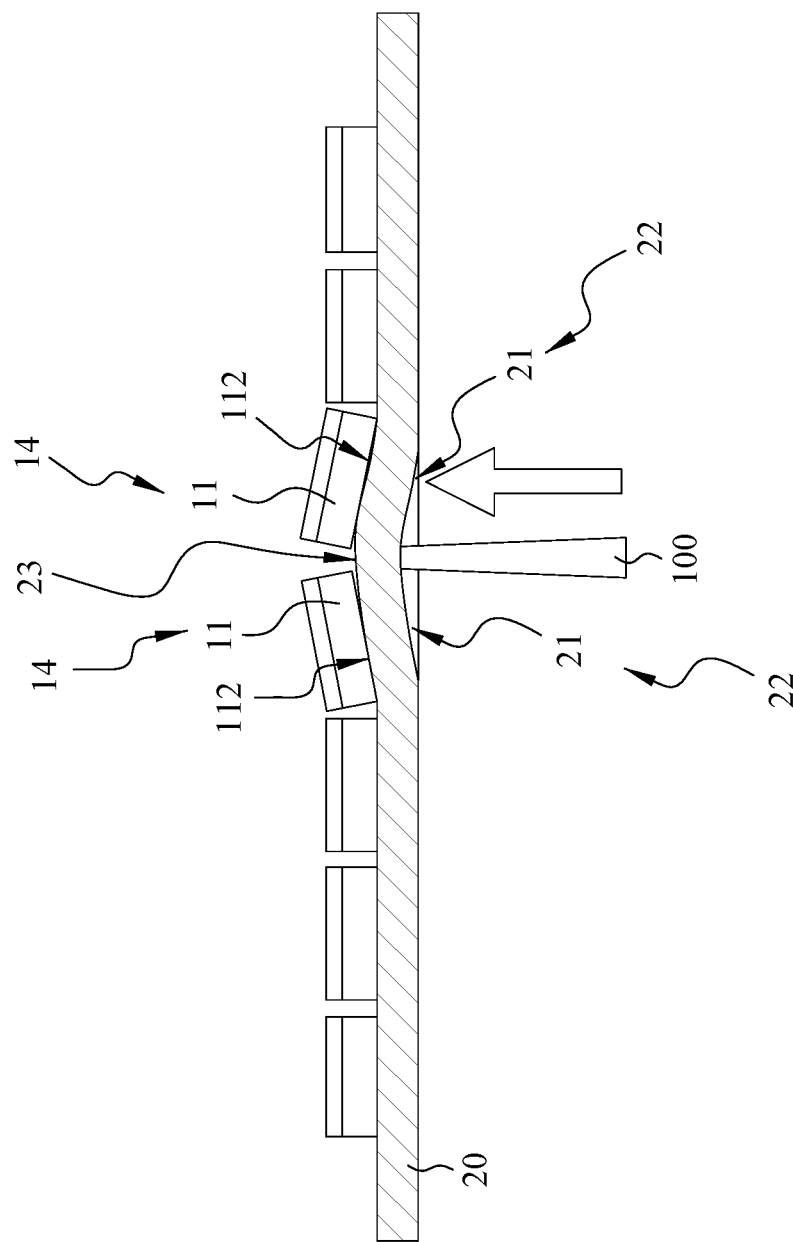
FIG. 9C is a cross-sectional view taken along line A-A of FIG. 9B.
Figure 10A:
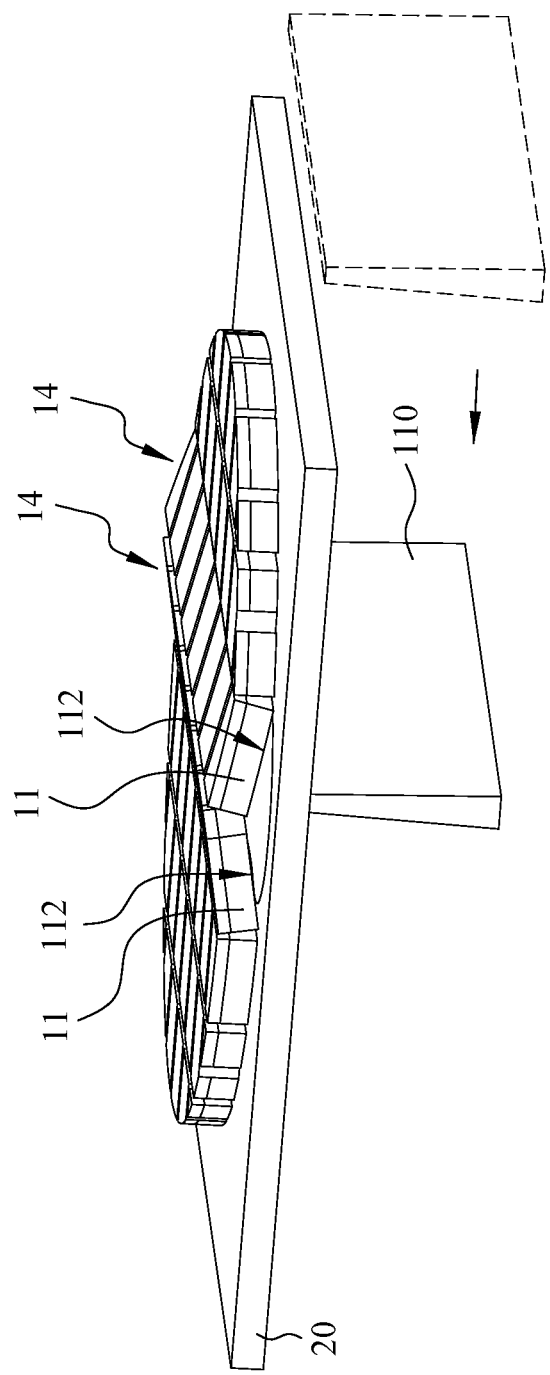
FIG. 10A is a perspective view of the second pre-edge/corner peeling method in step S400 of the hybrid die bonding method of the present invention.
Figure 10B:
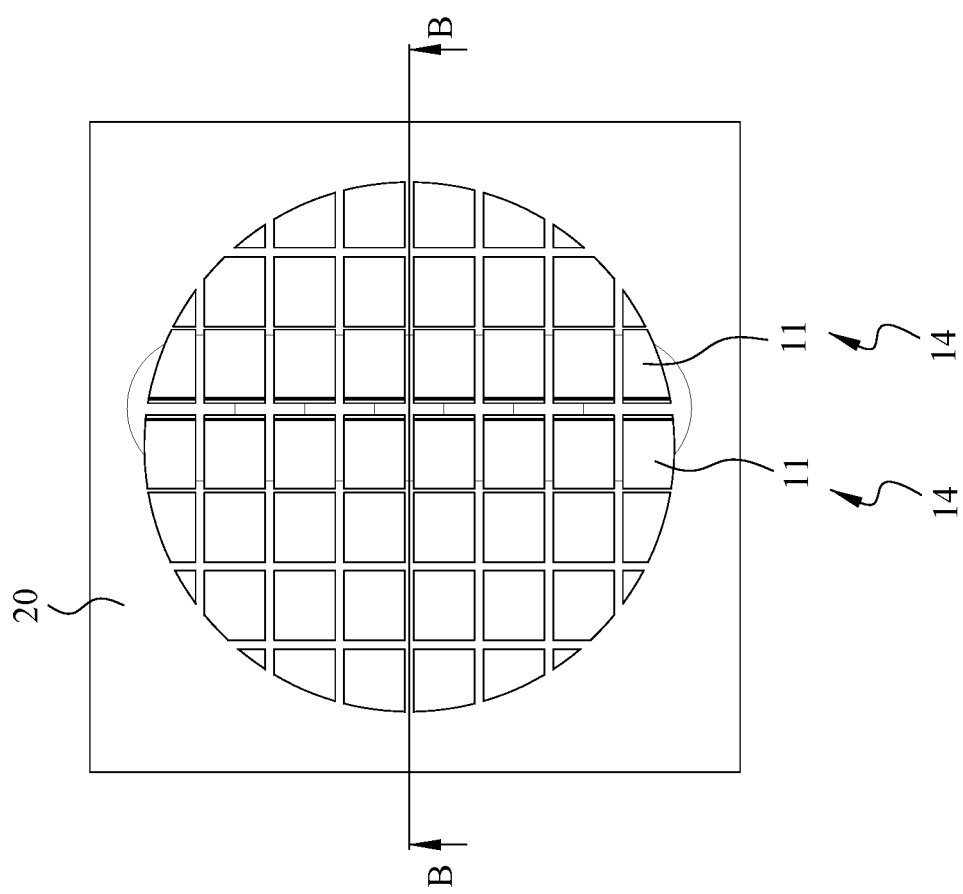
FIG. 10B is a top view of the second pre-edge/corner peeling method in step S400 of the hybrid bonding for fixing dies method of the present invention.
Figure 10C:
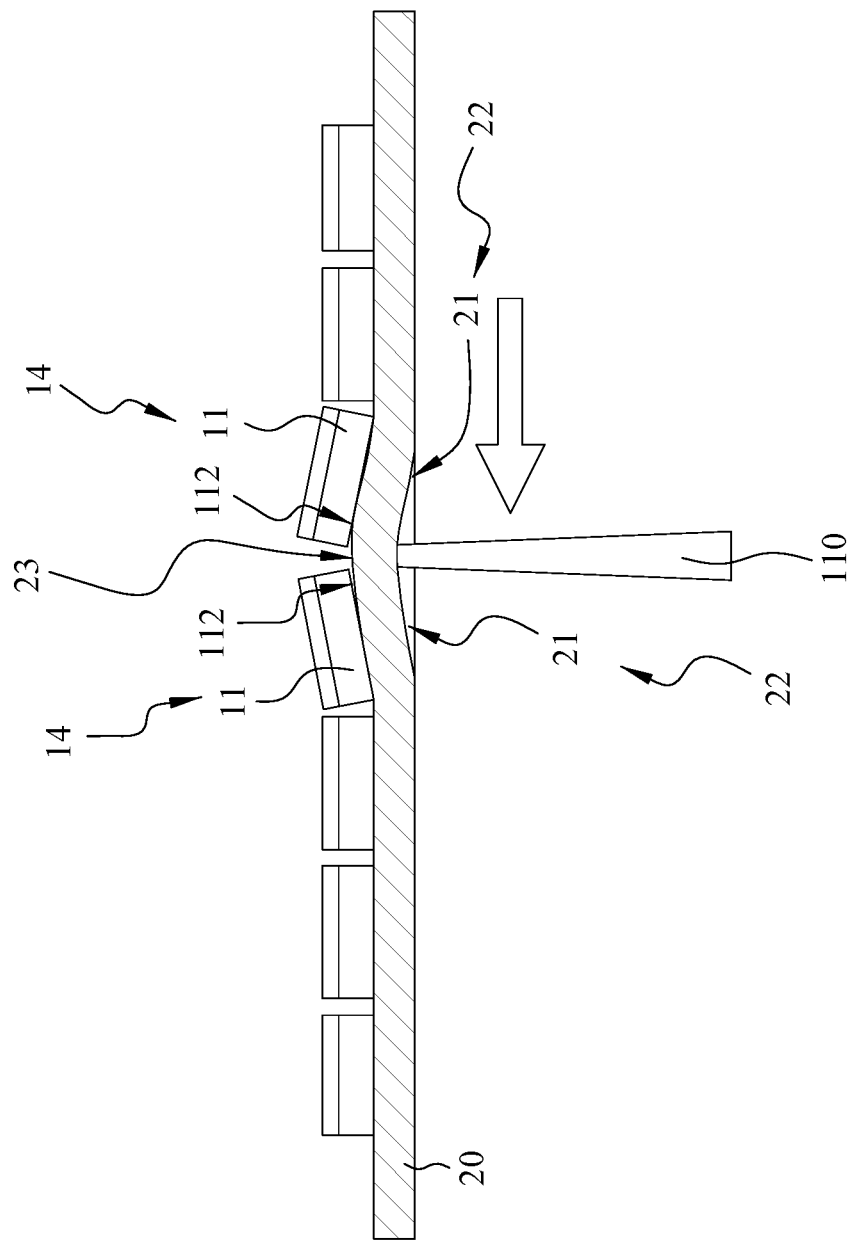
FIG. 10C is a cross-sectional view taken along line B-B of FIG. 10B.
Figure 11A:
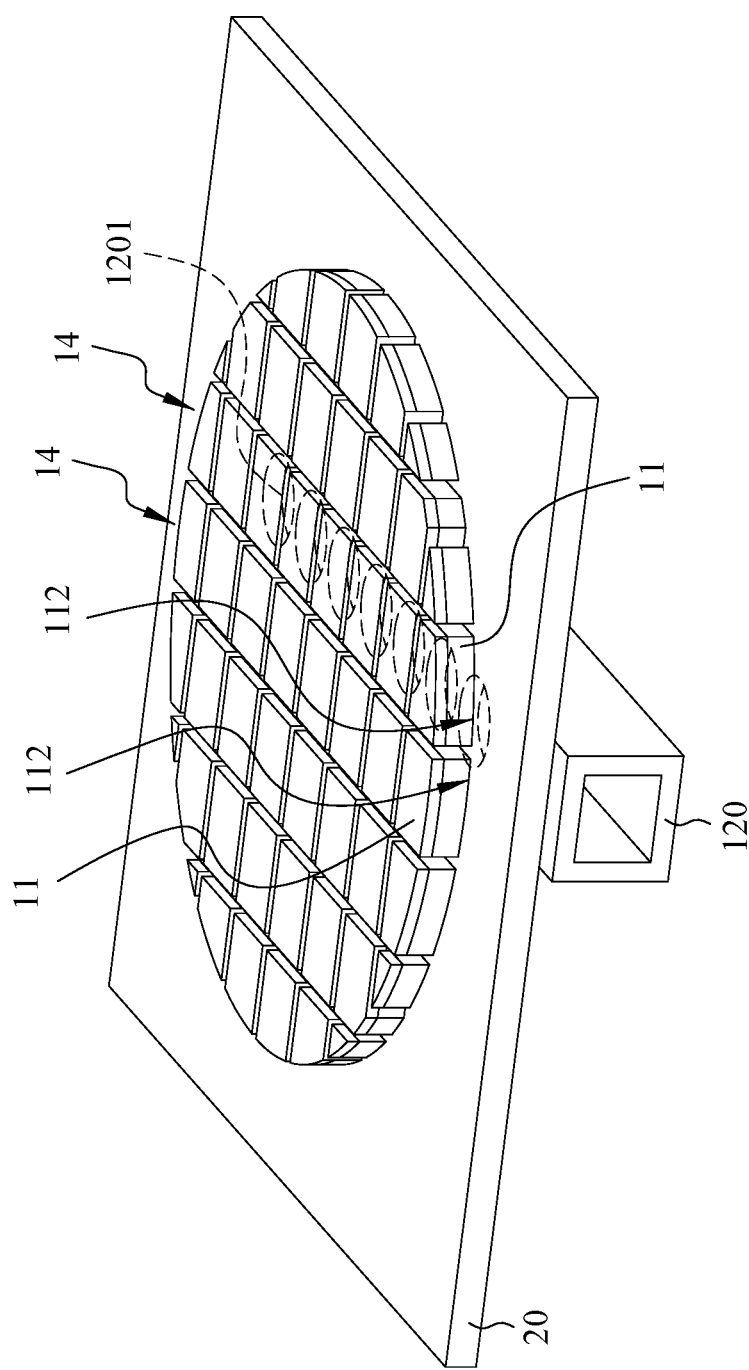
FIG. 11A is a perspective view of the third pre-edge/corner peeling method in step S400 of the hybrid die bonding method of the present invention.
Figure 11B:
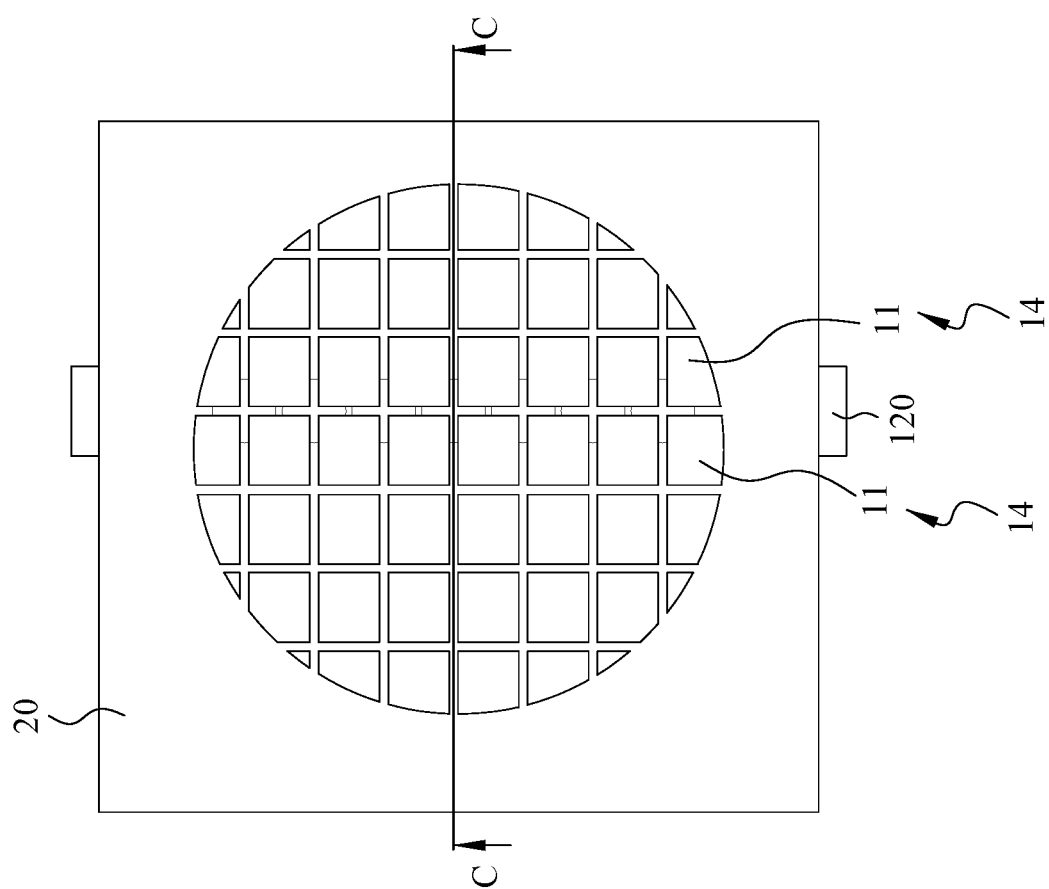
FIG. 11B is a top view of the third pre-edge/corner peeling method in step S400 of the hybrid die bonding method of the present invention.
Figure 11C:
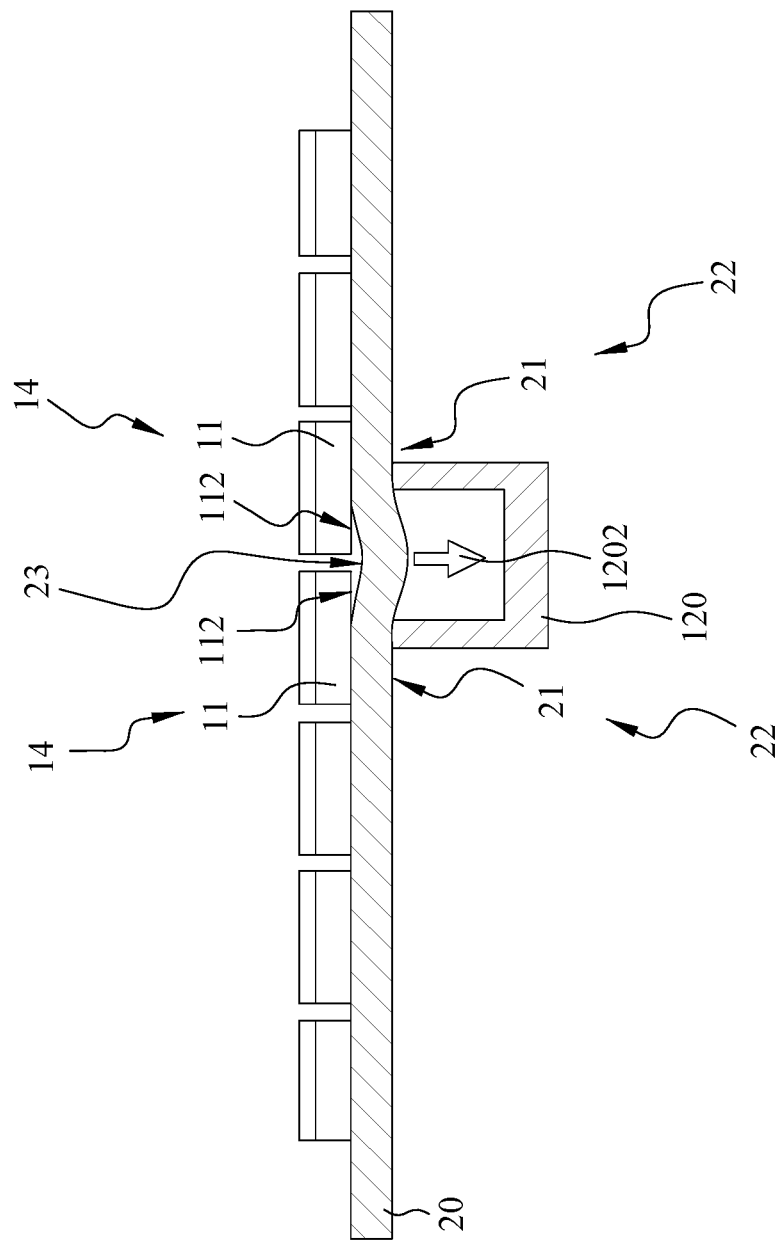
FIG. 11C is a cross-sectional view taken along line C-C of FIG. 11B.

FIGS. 9A, 9B, and 9C are respectively a perspective view, a top view and a cross-sectional view along line A-A in FIG. 9B in step S400 of the hybrid die bonding method of the present invention. FIGS. 10A, 10B, and 10C are respectively a perspective view, a top view and a cross-sectional view along the line B-B in FIG. 10B in the second pre-edge/corner peeling method in step S400 of the hybrid die bonding method of the present invention. FIGS. 11A, 11B, and 11C are respectively a perspective view, a top view and a cross-sectional view along the line C-C in FIG. 11B of the third pre-edge/corner peeling method in step S400 of the hybrid die bonding method of the present invention. The three pre-edge/corner peeling methods in step S400 will be described in detail below with reference to the drawings.

In the first pre-edge/corner peeling method, as shown in FIG. 9A, FIG. 9B and FIG. 9C, at least one pushing member 100 moves upward, and sequentially pushes the connecting areas 23 between the target blocks 21, the target blocks 21 are raised upward, so that the side portions and the corner portions of the second surfaces 112 of the dies 11 are peeled off away from the target blocks 21 but the remaining portions of the second surfaces 112 of the dies 11 are still attached to the carrier film 20. More specifically, the plurality of pushing members 100 are arranged in a row, and each pushing member 100 is aligned with the connection block 23 between the two target blocks 21 of the two adjacent rows of target blocks 22. The pushing members 100 move upward synchronously, and each pushing member 100 pushes the connecting area 23 between the two target blocks 21 of the two adjacent rows of target blocks 22, and the two target blocks 21 of the two adjacent rows of target blocks 22 are raised upward, so that, so that the side portions and the corner portions of the second surfaces 112 of all the dies 11 of the two adjacent rows of die combinations 14 are peeled off away from the two adjacent rows of target blocks 22; after the two rows of die combinations 14 has completed the peeling process, the pushing members 100 continue to perform the peeling process on the other two rows of die combinations 14 until all the rows of die combinations 14 have completed the peeling process.

In the second pre-edge/corner peeling method, as shown in FIGS. 10A, 10B and 10C, a scraper 110 moves horizontally along the surface of the carrier film 20, and sequentially pushes the connecting areas 23 between the target blocks 21. The target blocks 21 are raised upward, so that the side portions and the corner portions of the second surfaces 112 of the dies 11 are peeled off away from the target blocks 21 but the remaining portions of the second surfaces 112 of the dies 11 are still attached to the carrier film 20. More specifically, the scraper 110 moves horizontally along the surface of the carrier film 20 to the connecting area 23 between the two adjacent rows of target blocks 22; the scraper 110 pushes the connecting areas 23 of the two adjacent rows of target blocks 22, and the two adjacent rows of target blocks 22 are raised upward, so that the side portions and the corner portions of the second surfaces 112 of all the dies 11 of the two adjacent rows of die combinations 14 are peeled off away from all the target blocks 21 of the two adjacent rows of target blocks 22. After the two rows of die combinations 14 have completed the peeling process, the scraper 110 continues to perform the peeling process on the other two rows of die combinations 14 until all the rows of die combinations 14 complete the peeling process.

In the third pre-edge/corner peeling method, as shown in FIGS. 11A, 11B, and 11C, at least one channel 1201 of an adsorption device 120 provides a negative pressure 1202, and sequentially adsorbs the connecting areas 23 between the target blocks 21. The target blocks 21 are recessed downward, so that the side portions and the corner portions of the second surfaces 112 of the dies 11 are peeled off away from the target blocks 21 but the remaining portions of the second surfaces 112 of the dies 11 are still attached to the carrier film 20. More specifically, the plurality of channels 1201 of the adsorption device 120 are arranged in a row, and each channel 1201 is aligned with the connecting area 23 between the two target blocks 21 of the two adjacent rows of target blocks 22; the channels 1201 are synchronized to provide a negative pressure 1202, and each channel 1201 adsorbs the two target blocks 21 of the two adjacent rows of target blocks 22 by the negative pressure 1202, and the two target blocks of the two adjacent rows of target blocks 22 are recessed downward, so that the side portions sides and the corner portions of the second surfaces 112 of all the dies 11 of the two adjacent rows of die combinations 14 are peeled off away from all the target blocks 21 of the two adjacent rows of target blocks 22. After the two rows of die combinations 14 have completed the peeling process, the adsorption device 120 continues to perform the peeling process on the other two rows of die combinations 14 until all the rows of die combinations 14 complete the peeling process.

After the step S400 is completed, the side portions and the corner portions of the second surfaces 112 of the dies 11 are peeled off from the carrier film 20, and the centers of the second surfaces 112 of the dies 11 are still attached to the center of the carrier film 20.

Figure 12:
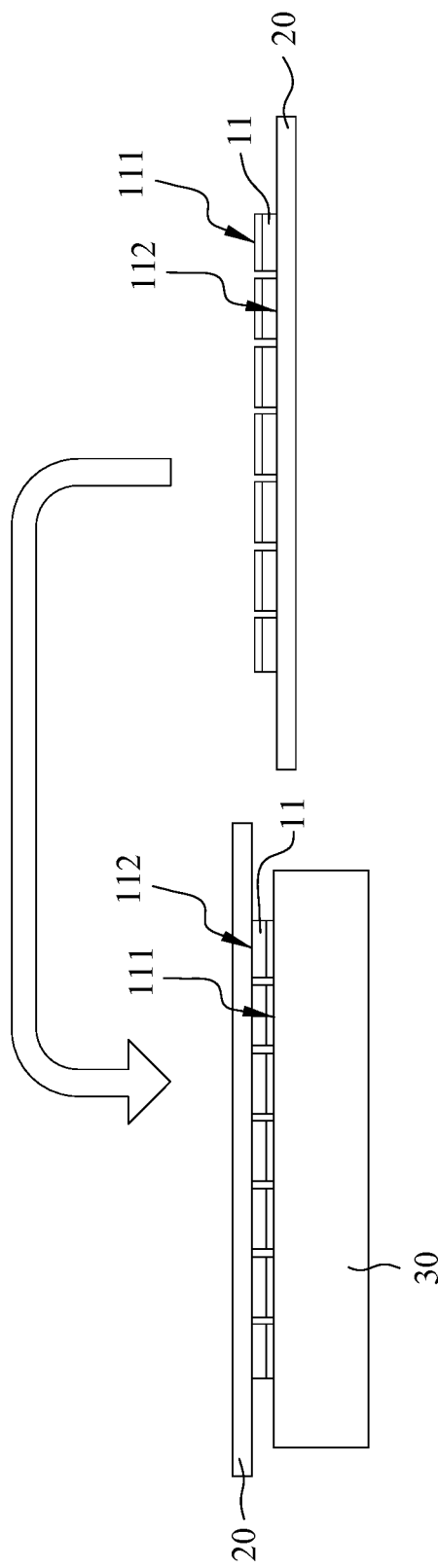
FIG. 12 is a schematic view of step S500 of the hybrid die bonding method of the present invention.

FIG. 12 is a schematic view of step S500 of the hybrid die bonding method of the present invention. In step S500, as shown in FIG. 12, before the carrier film 20 is turned over, the dies 11 are located above the carrier film 20, and after the carrier film 20 is turned over, the dies 11 are located below the carrier film 20. Because the viscosity of the carrier film 20 is still enough to stick to the centers of the dies 11, the dies 11 will not be detached from the carrier film 20 and fly out during the turning process of the carrier film 20, so that the dies 11 can be smoothly transferred to the first carrier 30.

Figure 13:
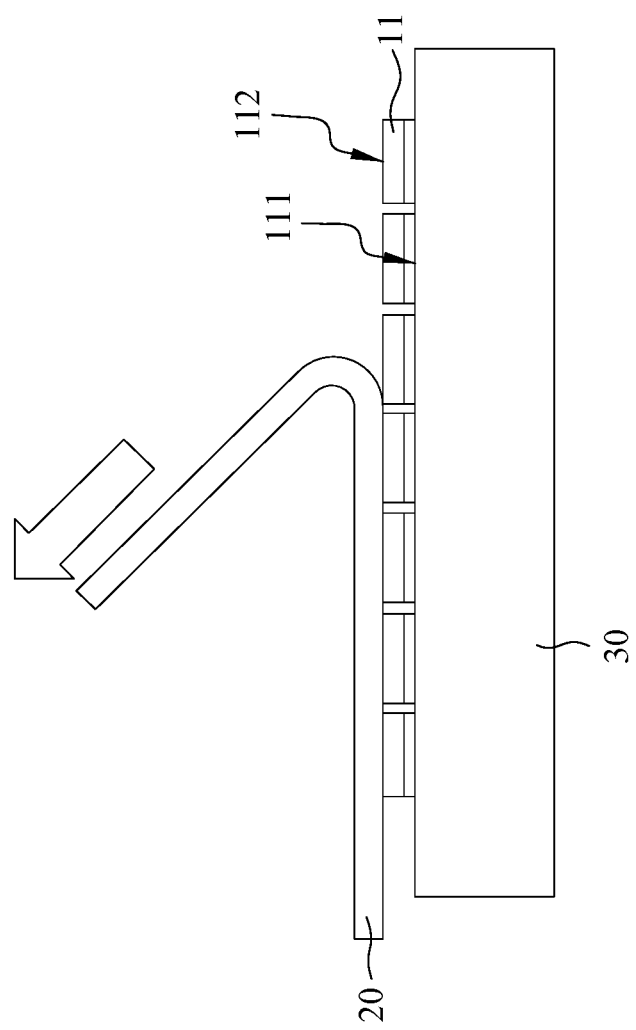
FIG. 13 is a schematic view of step S600 of the hybrid die bonding method of the present invention.

FIG. 13 is a schematic view of step S600 of the hybrid die bonding method of the present invention. In step S600, as shown in FIG. 13, one side or one corner of the carrier film 20 is pulled upwards, then pulled sideways, and finally the carrier film 20 is gradually removed from the second surfaces 112 of the dies 11.

Figure 14:
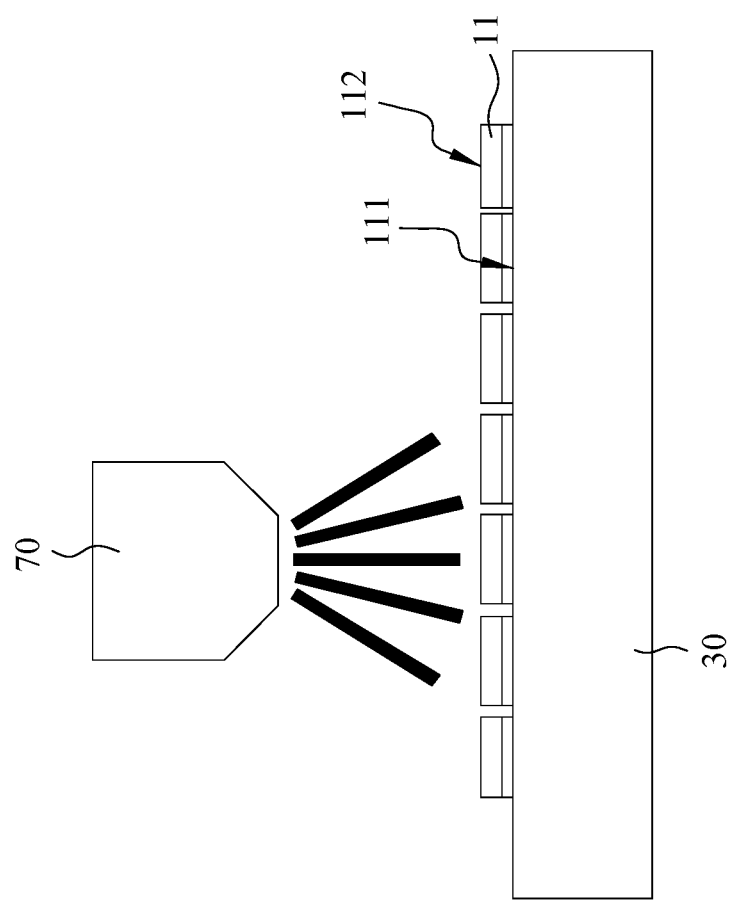
FIG. 14 is a schematic view of step S700 of the hybrid die bonding method of the present invention.

FIG. 14 is a schematic view of step S700 of the hybrid die bonding method of the present invention. In step S700, as shown in FIG. 14, the nozzle 70 sprays high-pressure gas, high-pressure liquid, or a mixture or plasma of high-pressure gas and high-pressure liquid to blow off or disperse the particles 12 from the second surfaces 112 of the dies 11, so that the particles 12 on the second surfaces 112 of the dies 11 are completely removed.

Figure 15:
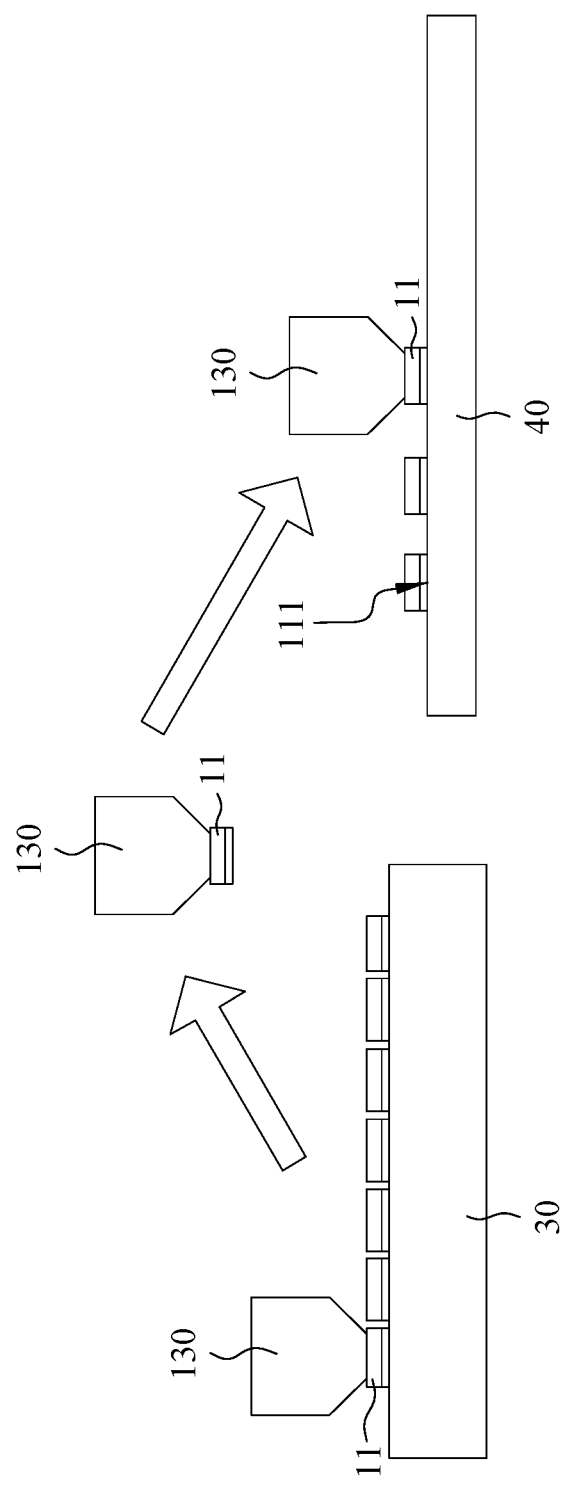
FIG. 15 is a schematic view of the first mode of die transfer in step S800 of the hybrid die bonding method of the present invention.
Figure 16:
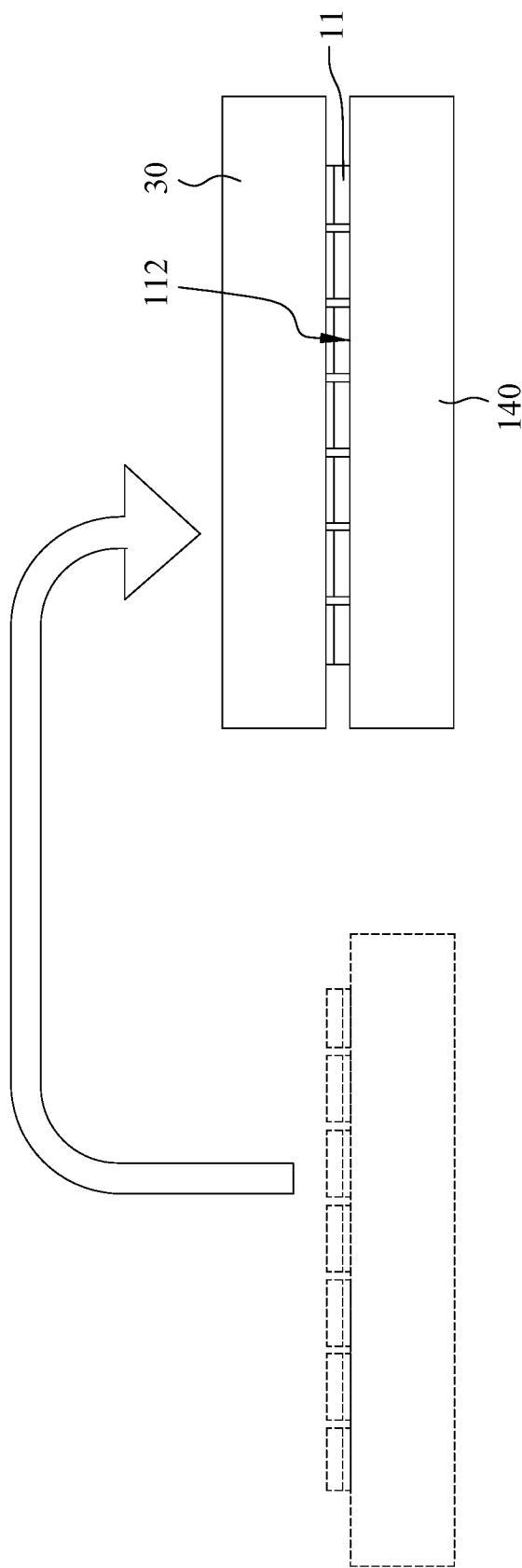
FIGS. 16 to 18 are schematic views of the second mode of die transfer in step S800 of the hybrid die bonding method of the present invention.
Figure 17:
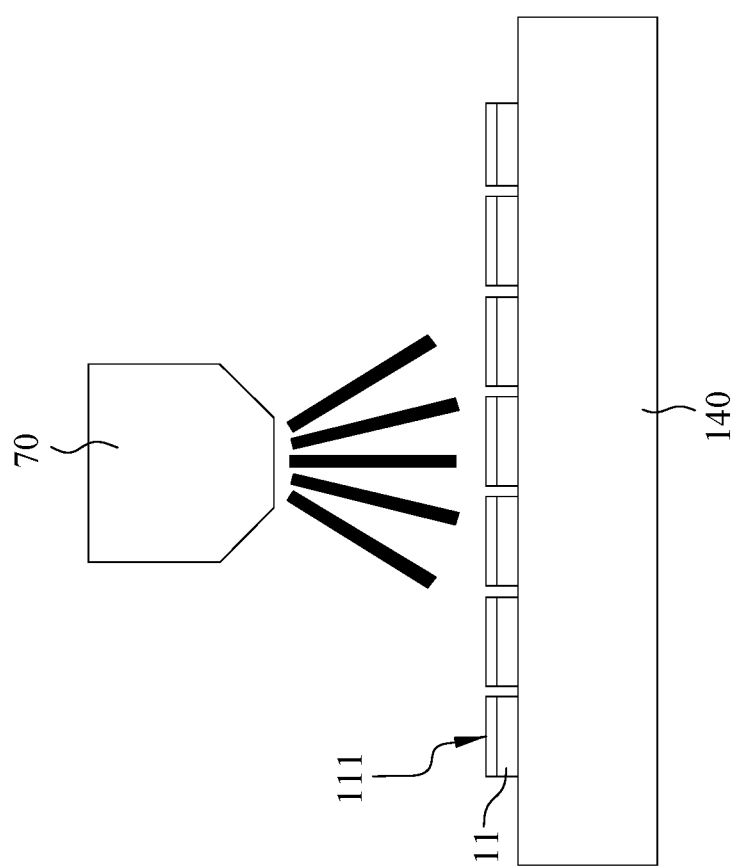
Figure 18:
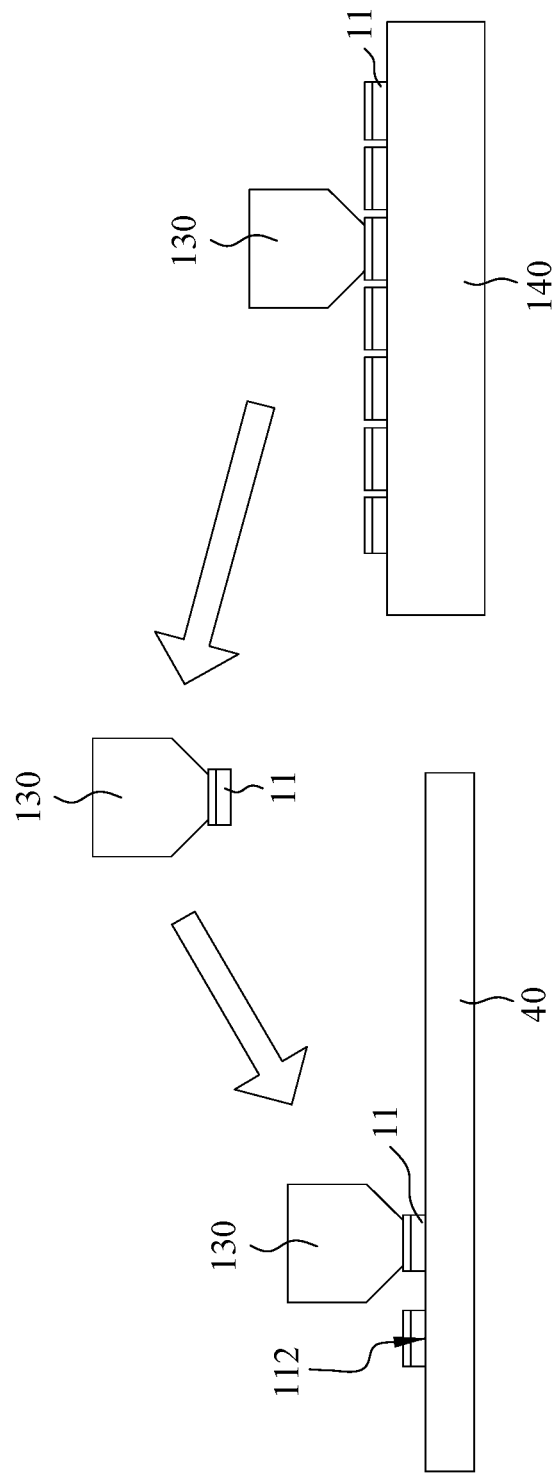

FIG. 15 is a schematic view of the first die transfer method in step S800 of the hybrid die bonding method of the present invention, and FIGS. 16 to 18 are the second die transfer method in step S800 of the hybrid die bonding method of the present invention. The two die transfer methods in step S800 will be described in detail below with reference to the drawings.

In the first die transfer method, as shown in FIG. 15, a pickup device 130 picks up a die 11 from the first carrier 30; the pickup device 130 moves the die 11; and the pickup device 130 places the die 11 on the substrate 40. The first surface 111 of the die 11 contacts with the substrate 40. The first die transfer method is repeatedly performed until all the dies 11 are transferred to the substrate 40.

The second die transfer method, as shown in FIG. 16, turns the first carrier 30 over, transfers the dies 11 to a second carrier 140, and the second surfaces 112 of the dies 11 contact with the second carrier 140. As shown in FIG. 17, the particles 12 on the first surfaces 111 of the dies 11 are removed. Specifically, the nozzle 70 sprays high-pressure gas, high-pressure liquid, or a mixture or plasma of high-pressure gas and high-pressure liquid to blow off or disperse the particles 12 from the first surfaces 111 of the dies 11, so that the particles 12 on the first surfaces 111 of the dies 11 are completely removed. As shown in FIG. 18, the pickup device 130 picks up a die 11 from the second carrier 140; the pickup device 130 moves the die 11; and the pickup device 130 place the die 11 on the substrate 40 with the second surface 112 of the die 11 in contact with the substrate 40. The second die transfer method is repeatedly performed until all the dies 11 are transferred to the substrate 40.

In summary, the present invention can peel off the sides and corners of the dies 11 from the carrier film 20, reducing the adhesive effect of the dies 11 being attached to the carrier film 20, thereby the dies 11 on the carrier film 20 can be transferred to the first carrier 30 in one run, and the carrier film 20 can be easily removed directly from the second surfaces 112 of the dies 11. Therefore, the transfer speed of the dies 11 is relatively fast, the efficiency is high, and the cost is low.

Furthermore, when the viscosity of the carrier film 20 is relatively high, the present invention can reduce the viscosity of the carrier film 20 first, and then peel off the sides and corners of the die 11 from the carrier film 20, so as to reduce the viscosity of the carrier film 20 as well as reduce the adhesive effect of the dies 11 being attached to the carrier film 20, thereby the dies 11 on the carrier film 20 can be transferred to the first carrier 30 in one run, and the carrier film 20 can be easily removed directly from the second surfaces 112 of the dies 11. Therefore, the transfer speed of the dies 11 is faster, the efficiency is higher, and the cost is lower.

In addition, the present invention can complete the peeling process for the two adjacent rows of die combinations 14 in one run, and all the rows of die combinations 14 can go through the peeling process several times, and then the sides and corners of the second surfaces 112 of the dies 11 can be peeled off from the target blocks 21, which greatly shortens the pre-edge/corner peeling time of the dies 11 and improves the pre-edge/corner peeling efficiency of the dies 11.

In addition, the present invention can completely remove the particles 12 on the first surfaces 111 and the second surfaces 112 of the dies 11, regardless of whether the first surfaces 111 or the second surfaces 112 of the dies 11 are to be bonded to the substrate 40. The bonding yield of the die 11 and the substrate 40 can be improved, and the die 11 and the substrate 40 will not co-encapsulate air bubbles to form a void. The bonding yield of the stacked dies 11 can also be improved.

In addition, the second die transfer method of the present invention can remove the particles 12 on the first surfaces 111 of the die 11 again, so as to prevent the residual particles from remaining 12 on the first surfaces 111 of the dies 11. Furthermore, the bonding yield between the die 11 and the substrate 40 or the bonding yield when the dies 11 are stacked on each other can be improved.

It is worth noting that the second die transfer method can also further turn the second carrier 140 over, transfer the dies 11 to the first carrier 30, and the first surfaces 111 of the dies 11 contact with the first carrier 30, and remove the particles 12 on the second surfaces 112 of the dies 11 to prevent the residual particles 12 from remaining on the second surfaces 112 of the dies 11, thereby improving the bonding yield between the die 11 and the substrate 40 or bonding yield when the dies 11 are stacked on each other.

If the dies 11 are repeatedly transferred to the first carrier 30 and the second carrier 140, the number of times of cleaning the first surface 111 and the second surface of the dies 11 can be increased, and the particles 12 on the first surfaces 111 and the second surfaces are removed to the extent that no particles remain, so as to ensure the best bonding yield between the dies 11 and the substrate 40 or when the dies 11 are stacked on each other.

More importantly, because the method of the present invention is developed for hybrid bonding technology, and the hybrid bonding technology is a tin-free bonding method, the present invention mainly uses the technology of dicing the wafer into dies without solder balls and without copper bumps. The substrate 40 without solder balls and without copper bumps is selected to emphasize that the method of the present invention is limited to use in hybrid bonding technology.

It should be noted that when performing tin-free packaging, the surfaces of the die 11 and the substrate 40 are very important. The surfaces of the die 11 and the substrate 40 will be directly connected to each other after the chemical-mechanical polishing process, so the surfaces of the die 11 and the substrate 40 must be close to the extent of a mirror surface, i.e., very smooth. The reason is that a slight change in the surface roughness may cause the bonding of the die 11 and the substrate 40 to fail. After the chemical-mechanical polishing process, due to the different materials, the degree of polishing is also different. Generally, the acceptable range of the error of the polishing degree, that is, the surface roughness Ra, is about ±10 nm, and if Ra exceeds 10 nm, two kinds of defects are prone to occur: (1) The copper contacts are over-polished; (2) Too much copper contact is reserved, and the base of the substrate 40 is over-polished.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A hybrid die bonding method, comprising the following steps of:
    dicing a wafer into a plurality of dies, the dies being distributed on a plurality of target blocks of a carrier film, each die having a first surface on a top and a second surface on a bottom attached to the carrier film with no solder or bump on the first and second surfaces;
    removing particles on the first surfaces of the plurality of dies;
    peeling off side portions and corner portions of the second surfaces of the dies away from the target blocks of the carrier film with remaining portions of the second surfaces of the dies still attached to the carrier film;
    turning over the carrier film, and transferring the plurality of dies to a first carrier with the first surfaces of the dies contacting the first carrier;
    removing the carrier film from the second surfaces of the dies;
    cleaning particles on the second surfaces of the dies; and
    transferring the dies from the first carrier to a substrate, the substrate having no solder or bump on surfaces;
    wherein the step of dicing the wafer into a plurality of dies further includes dicing the wafer into a plurality of rows of the dies, the plurality of rows of the dies being distributed on a plurality of corresponding rows of the target blocks of the carrier film; and the step of peeling off the side portions and the corner portions of the second surfaces of the dies away from the target blocks further includes the steps of:
    performing a peeling off process on two adjacent rows of the dies by pressuring connecting areas between two adjacent corresponding rows of the target blocks upward or downward so that the side portions and the corner portions of the second surfaces of the two adjacent rows of the dies are peeled off away from the carrier film but the remaining portions of the second surfaces of the two adjacent rows of the dies are still attached to the carrier film; and
    continuing to perform the peeling off process on another two adjacent rows of the dies until the peeling off process is completed for all rows of the dies.

2. The hybrid die bonding method according to claim 1, wherein the step of removing particles on the first surfaces of the dies further includes a step of de-bonding the carrier film.

3. The hybrid die bonding method according to claim 2, wherein the carrier film is a UV release film, and an ultraviolet light is irradiated on the carrier film in the step of de-bonding the carrier film.

4. The hybrid die bonding method according to claim 2, wherein the carrier film is a pyrolytic adhesive film, and the carrier film is heated in the step of de-bonding the carrier film.

5. The hybrid die bonding method according to claim 1, wherein performing the peeling process on two adjacent rows of the dies by pressuring connecting areas between two adjacent corresponding rows of the target blocks upward or downward is accomplished by using at least one pushing member to push the connecting areas upward.

6. The hybrid die bonding method according to claim 1, wherein performing the peeling process on two adjacent rows of the dies by pressuring connecting areas between two adjacent corresponding rows of the target blocks upward or downward is accomplished by moving a scraper along a bottom surface of the carrier film to the connecting areas and pushing the connecting areas upward.

7. The hybrid die bonding method according to claim 1, wherein performing the peeling process on two adjacent rows of the dies by pressuring connecting areas between two adjacent corresponding rows of the target blocks upward or downward is accomplished by using at least one channel of an adsorption device to provide a negative pressure under the connecting areas to adsorb the connecting areas downward.

8. The hybrid die bonding method according to claim 1, wherein the step of transferring the dies from the first carrier to the substrate further comprises the steps of: picking up the dies from the first carrier; moving the dies; and placing the dies on the substrate with the first surfaces of the dies in contact with the substrate.

9. The hybrid die bonding method according to claim 1, wherein the step of transferring the dies from the first carrier to the substrate further comprises the steps of: flipping the first carrier and transferring the dies to a second carrier, the second surfaces of the dies contacting with the second carrier; removing particles from the first surfaces of the dies; picking up the dies from the second carrier; moving the dies; and placing the dies on the substrate, the second surfaces of the dies contacting with the substrate.

* * * * *